United States Patent
Barnes

(10) Patent No.: US 6,404,238 B1
(45) Date of Patent: Jun. 11, 2002

(54) RATIO LOGIC GATE WITH A CURRENT MIRROR

(75) Inventor: William Bryan Barnes, Bristol (GB)

(73) Assignee: STMicroelectronics Limited, Almondsbury Bristol (GB)

(*) Notice: Subject to any disclaimer, the term of this patent is extended or adjusted under 35 U.S.C. 154(b) by 0 days.

(21) Appl. No.: 09/643,065

(22) Filed: Aug. 21, 2000

(30) Foreign Application Priority Data

Aug. 24, 1999 (GB) ................................. 9920082

(51) Int. Cl.[7] .................. H03K 19/20; H03K 19/094

(52) U.S. Cl. .................. 326/119; 326/83; 326/112

(58) Field of Search .................. 326/119, 121, 326/122, 36, 83

(56) References Cited

U.S. PATENT DOCUMENTS

| | | | | |
|---|---|---|---|---|
| 4,797,580 A | * | 1/1989 | Sunter | 326/98 |
| 4,883,988 A | * | 11/1989 | Ide et al. | 326/66 |
| 5,039,886 A | | 8/1991 | Nakamura et al. | 307/475 |

FOREIGN PATENT DOCUMENTS

JP 05036280 A * 2/1993 .................. 365/177

* cited by examiner

*Primary Examiner*—Michael Tokar
*Assistant Examiner*—Daniel D. Chang
(74) *Attorney, Agent, or Firm*—Wolf, Greenfield & Sacks, P.C.; James H. Morris; Robert A. Skrivanek, Jr.

(57) ABSTRACT

A ratio logic gate has a current mirror controlled by the pull-down transistors and supplying a half size pull-down transistor. When one or more of the input pull-down transistors is on, the mirror current overcomes the output pull-down transistor to provide a high potential output. Process tolerances between p and n type devices is thus avoided.

16 Claims, 4 Drawing Sheets

RATIO LOGIC GATE WITH A CURRENT MIRROR

FIELD OF THE INVENTION

The present invention relates to a logic gate and more specifically to an FET logic gate of the so-called ratio logic family.

BACKGROUND OF THE INVENTION

There is known in the art a number of different logic families, one of which is termed ratio logic. In ratio logic a pull-up device is connected between a high supply potential and a circuit node and a number of pull-down devices are connected between the circuit node and a negative supply potential. The pull-up device is permanently enabled and thus the circuit node is at a high potential provided the pull-down device are all inoperative. When one or more pull-down devices operates then the circuit node is at a relatively low level. Typically the pull-up device is a PMOS transistor and the pull-down devices are NMOS transistors.

There is then the requirement that the PMOS transistor must be of weaker conductivity than one NMOS, otherwise the output node will not be pulled down sufficiently to indicate a change in logic state.

The requirement for a weak PMOS extends the pull-up time of the circuit node. This is because allowance must be made during design for the p transistors of a circuit to be at the strong end of their tolerance and the n transistors to be at the weak ends of their tolerance. Then, when the opposite process conditions appear, namely the p transistors being weaker than expected and the n transistors being stronger than expected the pull-up time may be excessive; it is this worst case rise time which is specified for the circuit.

It is accordingly an object of the present invention to at least partially mitigate the difficulties of the prior art.

SUMMARY OF THE INVENTION

According to the present invention there is provided a logic gate comprising a current mirror circuit having a supply node, a first node and a second node wherein application of a first current at the first node causes a second current at the second node, plural input pull-down transistors connected between a reference node and one of said first and second nodes, and an output pull-down transistor connected between the other of said first and second nodes, and the reference terminal wherein the supply node has a connection to a supply terminal, the plural input pull-down transistors have respective control terminals connected to a corresponding plurality of input terminals and the output pull-down transistor has circuitry connected to its control node for biasing it on wherein said input pull-down transistors are mutually substantially identical and wherein said output pull-down transistor is smaller than each said input pull-down transistor.

Conveniently said plural input transistors are connected to said first node.

Preferably the current mirror circuit has a pair of FETs having a common drain/source connection as said supply node, and common gates, one of said pair having its source/drain connected to its gate and said control node, and the other of said pair having its source/drain as said output node.

Conveniently said logic gate further comprises an enable transistor connected between said supply node and said supply terminal.

Advantageously each said pull-down transistor is an n FET and said pair of FETs are p FETs.

Advantageously said enable transistor is a p FET.

According to a second aspect of the present invention there is provided a logic gate comprising a current mirror circuit having a supply node, a first node and a second node wherein application of a first current at the first node causes a second current at the second node, plural input pull-down transistors connected between a reference node and one of said first and second nodes, and an output pull-down transistor connected between the other of said first and second nodes, and the reference terminal wherein the supply node has a connection to a supply terminal, the plural input pull-down transistors have respective control terminals connected to a corresponding plurality of input terminals and the output pull-down transistor has circuitry connected to its control node for biasing it on, wherein said input pull-down transistors are mutually substantially identical and said output pull-down transistor is substantially the same as each said input pull-down transistor and the current mirror has a non-unity ratio.

Advantageously at least one input pull-down transistor is connected in series with a second input pull-down transistor.

Conveniently the gate further comprises a disabling transistor connected between said reference node and one of said first and second nodes.

Preferably the gate further comprises an inverter having a circuit output, said inverter being connected to one of said first and second nodes.

BRIEF DESCRIPTION OF THE DRAWINGS

Various embodiments of the present invention will now be described, by way of example only, with reference to the accompanying drawings in which.

DESCRIPTION OF THE PREFERRED EMBODIMENTS

Figure 1:
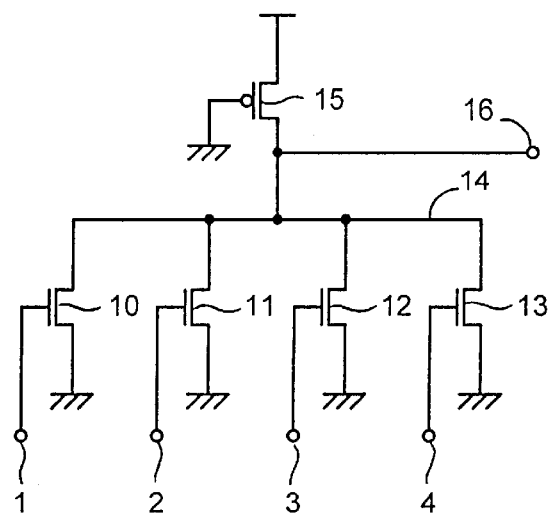
FIG. 1 shows a logic gate of the prior art.

In the various figures like reference numerals indicate like parts.

Referring first to FIG. 1 four input terminals 1–4 are connected to respective gates of pull-down N FETS 10–13. The sources of each of the pull-down transistors 10–13 are connected to earth and the drains of the transistors are connected to a common node 14.

A pull-up p transistor 15 is connected between the circuit node 14 and the positive supply VCC. The P transistor has its gate connected to earth so that the transistor is permanently on. The common node 14 is connected to an output terminal 16.

In operation, when all of the input terminals 1–4 are held at a low voltage, none of the input n FETS 10–13 conducts. By contrast, the permanently on p FET 15 causes the output terminal 16 to be substantially at the positive supply voltage VCC.

When at least one of the input terminals 1–4 is at a high potential, then a corresponding number of pull-down transistors 10–13 is switched on and the output node 16 is pulled low.

It will be clear to those skilled in the art that for correct operation of the circuit to occur, any one of the pull-down transistors must be capable of "overcoming" the pull-up transistor 15. Thus, the p transistor 15 must be weaker than one of the n transistors 10–13.

As previously discussed, this limits the pull-up time performance.

The logic gate of FIG. 1 is an NOR gate in that when at least one input is supplied with a logic one, the output will be at logic 0; otherwise the output is at logic 1.

Figure 2:
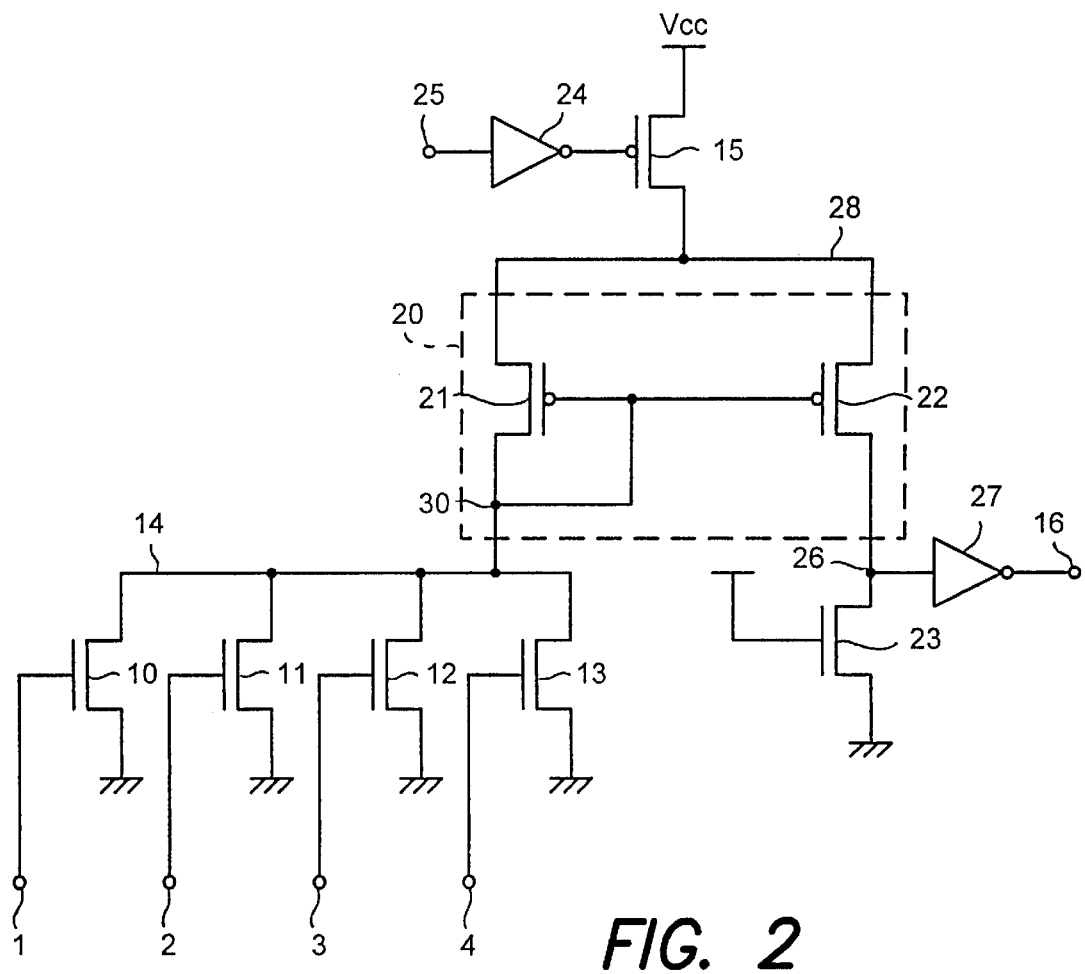
FIG. 2 shows a first embodiment logic gate in accordance with the present invention and FIGS. 3–7 show second-fifth embodiments of logic gates in accordance with the present invention.

Referring now to FIG. 2, the common node 14 of the four input transistors 10–13 is connected to the control node 30 of a current mirror circuit 20. The current mirror circuit further has an output node 26 and a supply node 28. As seen in FIG. 2, the current mirror has a controlling transistor 21 being a p FET having a source/drain electrode commoned to its gate and a drain/source electrode forming the supply node 28. The current mirror further has a controlled p transistor 22 having a gate connected to the gate of the controlling transistor 21, a drain/source electrode connected to the supply node 28 and a source/drain electrode as the output node 26. The output node 26 is connected to ground via an n FET 23 is connected to the positive supply VCC so as to be permanently on. The supply node 28 is connected to the positive supply VCC via a p transistor whose gate is connected to an enable terminal 25 via an inverter 24. The output node 26 is connected to the output terminal 16 via an inverter 27.

The input n FETs 10–13 are identical and the n FET 23 connecting the output node 26 to earth is half the size of the input transistors.

When none of the input terminals 1–4 is connected to a high potential, all of the input transistors are turned off and no current flows through the control node 30 of the current mirror. As a result, no current flows out of the output node 26 which is thus able to be pulled down to earth by the permanently-on n transistor 23.

When one of the input transistors 10–13 is turned on by an appropriate potential at the corresponding input terminal 1–4, a current flows from the control node 30 of the current mirror 20 and a similar current flows to the output node 26 from the supply node 28. This current causes the output node 26 to go to a high potential. When more than one of the input transistors is turned on, the current will be proportionately higher and the output node will be pulled more strongly higher.

When the output node is high, the output terminal 16 is low, due to the action of the inverter 27; when the output node 26 is low, the output terminal 16 will be high.

An enabling transistor 15 is placed in circuit between the supply node 28 and the supply potential VCC. The enabling transistor 15 is connected to an enable terminal 25 via the inverter 24 such that when the enable terminal is high the enabling transistor 15 is turned on, thus supplying current to the current switch 20. When the enable terminal 25 is low, the enable transistor 15 is turned off and, regardless of the state of the input terminals 1–4, the output node 26 will be pulled low and the output terminal will be high.

It will be understood from the foregoing description and by reference to FIG. 2 that the circuit of FIG. 2 does not require the pull-down effect of one or more NMOS transistors to overcome a PMOS transistor, but instead requires a large NMOS transistor to overcome a relatively small NMOS transistor. As a result there is no cross conductivity process dependency because the tolerances which affect one n transistor will be the same as affects the other n transistors. The circuit of FIG. 2 may therefore be implemented to provide an improved pull-up performance with respect to the prior art.

Figure 3:
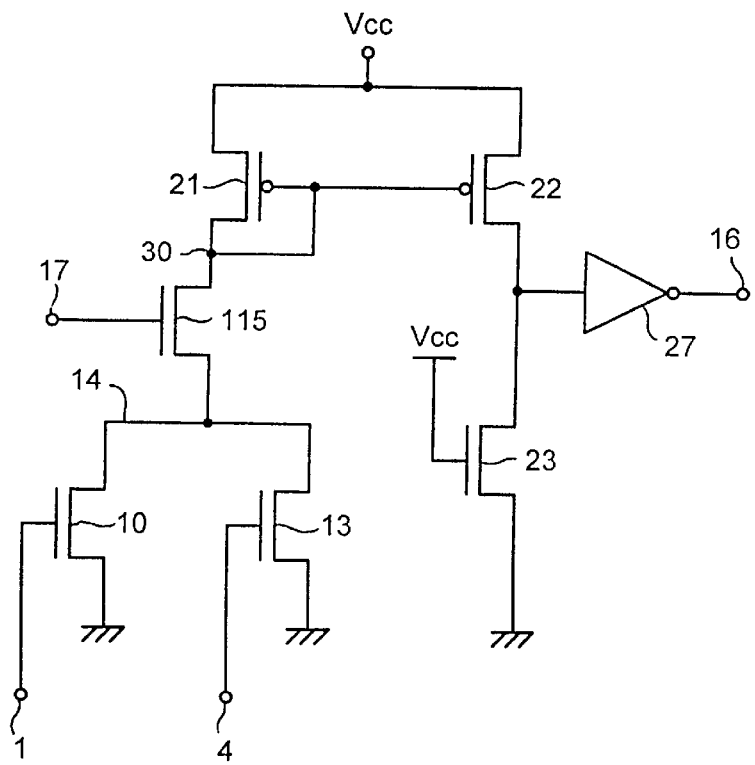
Figure 4:
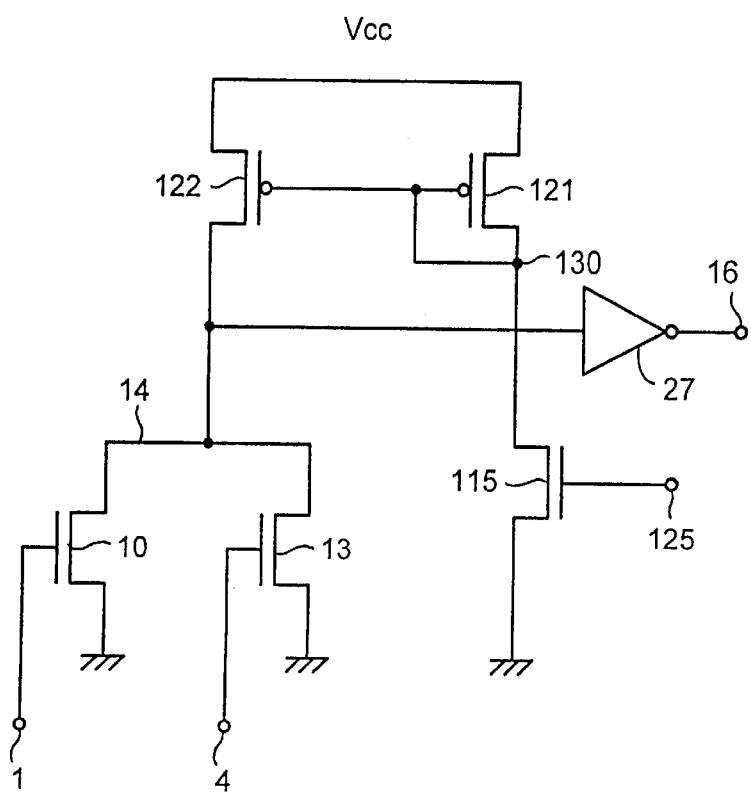

Referring now to FIG. 3, the second embodiment is similar to that of FIG. 2 although it will be seen that the enabling transistor 115 is an n transistor connected between the control node 30 of the current mirror and the common node 14 of the input transistors 10–13 (of which only two are shown for clarity). The enabling transistor 115 has a gate terminal connected to an enable terminal 17 such that a high potential applied to the enable terminal 17 turns the enabling transistor 115 on, and a low potential applied to that terminal turns the transistor off. Referring now to FIG. 4, a third embodiment uses a reversed current mirror comprising two p FETs 121 and 122, of which the first p FET 121 has a diode connection and a control node 130 which is selectively connected to the reference potential via an n channel FET 115, having a control gate connected to an enable terminal 125. The second p FET 122 is connected to the common node 14 of the input pull-down transistors 10–13 and the common node 14 is connected via the output inverter 27 to the output terminal 16. The embodiment of FIG. 4 provides a reduction in output delay. However, if all of the inputs 1–4 can be 0 when the circuit is not enabled, then the common node 14 would need a further pull-down arrangement controlled by a not enable signal to ensure that false outputs do not occur.

Figure 5:
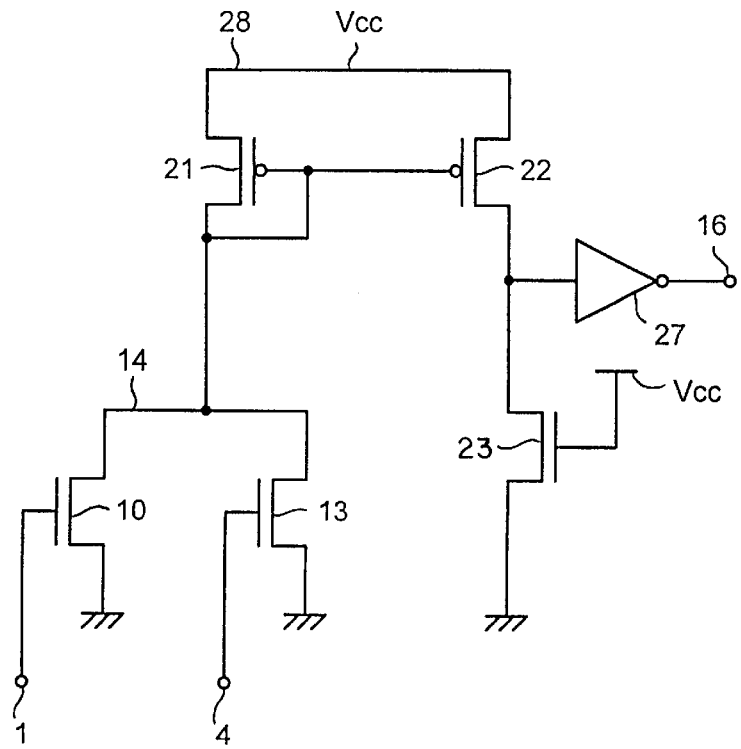

Referring now to FIG. 5, a fourth embodiment is substantially similar to that of FIG. 2, save for the omission of the enable transistor. In this case, the supply node 28 is connected direct to the positive voltage supply VCC. This embodiment is applicable where it can be ensured that all of the inputs are off when a low current state must be achieved.

Figure 6:
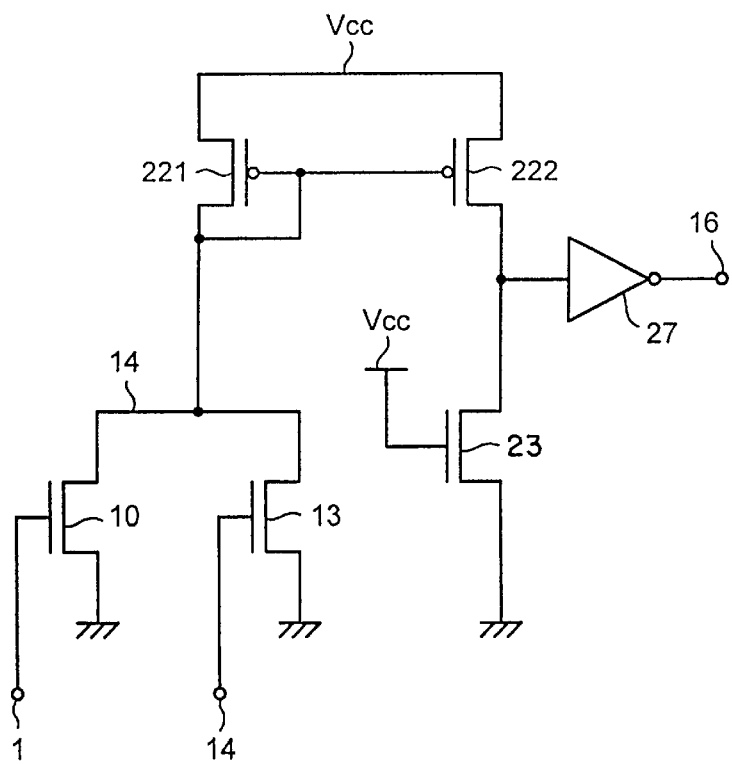

Referring now to FIG. 6, a fifth embodiment is similar to that described with respect to FIG. 5, save that the output pull-down transistor 23 is the same size as each of the input pull-down transistors 10–13, the necessary ratio between the currents being formed using the transistors of the current mirror. To that effect, the width of the diode-connected controlling p FET 221 is half that of the controlled output p FET 222.

Figure 7:
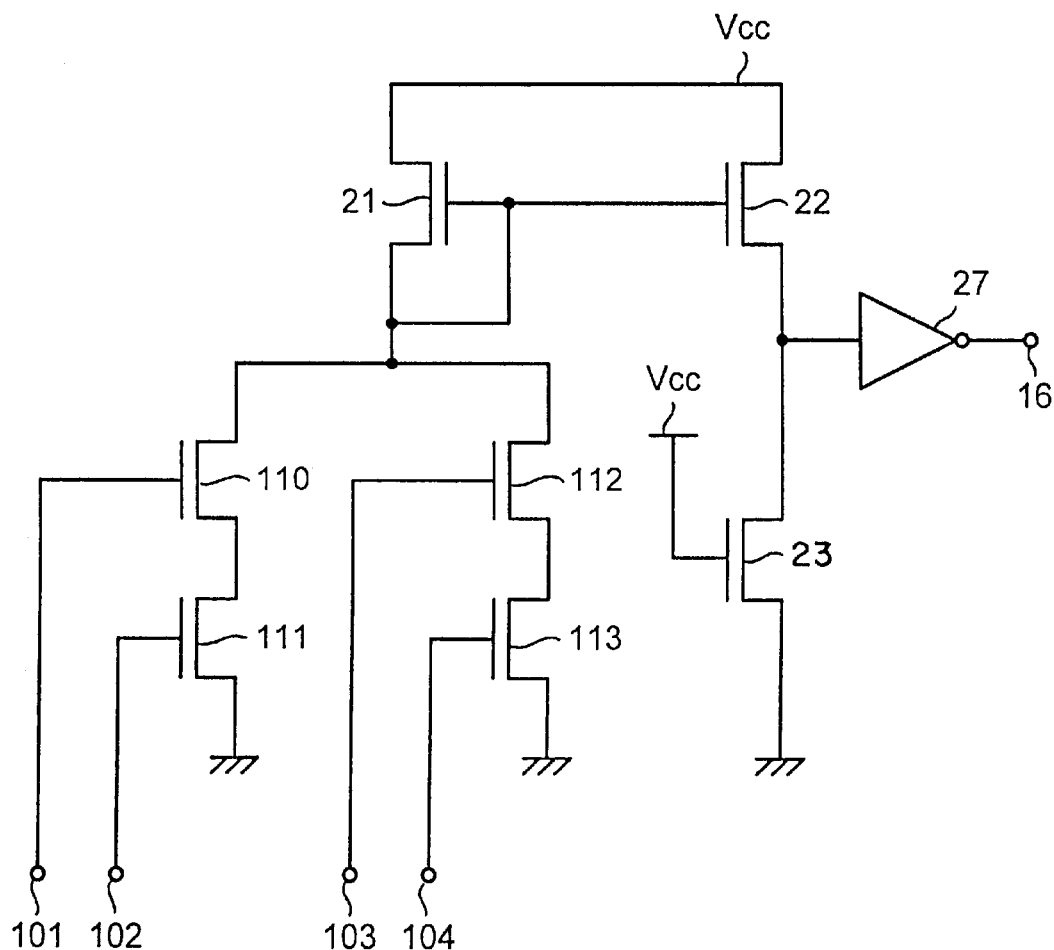

Referring to FIG. 7, a sixth embodiment is shown in which the logic function is different to that achieved with the remaining embodiments. It will be seen to that end that each of the transistors 10, 13 of FIG. 5 is replaced by two series transistors 110, 111; 112, 113. Each of the transistors has its own input terminal 101–104 so that the logic gates operates when either input 101 AND 102, OR 103 AND 104 are logic one. It will be clear to those skilled in the art that many other logic relationships can be achieved.

What is claimed is:

1. A logic gate comprising a current mirror circuit having a supply node, a first node and a second node wherein application of a first current at said first node causes a second current at said second node, plural input pull-down transistors connected in parallel between a reference node and one of said first and second nodes, and an output pull-down transistor connected between the other of said first and second nodes and said reference node, wherein said supply node has a connection to a supply terminal, said plural input pull-down transistors have respective control terminals connected to a corresponding plurality of input terminals, and said output pull-down transistor has circuitry connected to its control node for biasing it on, wherein said plural input pull-down transistors are mutually substantially identical and wherein said output pull-down transistor is smaller than each of said plural input pull-down transistors.

2. The logic gate of claim 1, wherein said plural input pull-down transistors are connected to said first node.

3. The logic gate of claim 1 wherein the current mirror circuit has a pair of FETs having a common drain/source connection as said supply node, and common gates, one of said pair having its source/drain connected to its gate and said first node, and the other of said pair having its source/drain as said second node.

4. The logic gate of claim 3 wherein each of said plural input pull-down transistors is an n FET and said pair of FETs are p FETs.

5. The logic gate of claim 1 wherein at least one of said plural input pull-down transistors is connected in series with a second of said plural input pull-down transistors.

6. The logic gate of claim 1 further comprising an inverter having a circuit output, said inverter being connected to one of said first and second nodes.

7. A logic gate comprising a current mirror circuit having a supply node, a first node and a second node wherein application of a first current at said first node causes a second current at said second node, plural input pull-down transistors connected between a reference node and one of said first and second nodes, and an output pull-down transistor connected between the other of said first and second nodes and said reference node, wherein said supply node has a connection to a supply terminal, said plural input pull-down transistors have respective control terminals connected to a corresponding plurality of input terminals, and said output pull-down transistor has circuitry connected to its control node for biasing it on, wherein said plural input pull-down transistors are mutually substantially identical and wherein said output pull-down transistor is smaller than each of said plural input pull-down transistors;

the logic circuit further comprising an enable transistor coupled between said supply node and said supply terminal.

8. The logic gate of claim 7 wherein said enable transistor is a p FET.

9. A logic gate comprising a current mirror circuit having a supply node, a first node and a second node wherein application of a first current at said first node causes a second current at said second node, plural input pull-down transistors connected between a reference node and one of said first and second nodes, and an output pull-down transistor connected between the other of said first and second nodes and said reference node, wherein said supply node has a connection to a supply terminal, said plural input pull-down transistors have respective control terminals connected to a corresponding plurality of input terminals, and said output pull-down transistor has circuitry connected to its control node for biasing it on, wherein said plural input pull-down transistors are mutually substantially identical and wherein said output pull-down transistor is smaller than each of said plural input pull-down transistors;

wherein said plural input pull-down transistors are connected to said first node; and wherein the logic circuit further comprises an enable transistor connected between said plural input pull-down transistors and said first node.

10. A logic gate comprising a current mirror circuit having a supply node, a first node and a second node wherein application of a first current at said first node causes a second current at said second node, plural input pull-down transistors connected between a reference node and one of said first and second nodes, and an output pull-down transistor connected between the other of said first and second nodes and said reference node, wherein said supply node has a connection to a supply terminal, said plural input pull-down transistors have respective control terminals connected to a corresponding plurality of input terminals, and said output pull-down transistor has circuitry connected to its control node for biasing it on, wherein said plural input pull-down transistors are mutually substantially identical and wherein said output pull-down transistor is smaller than each of said plural input pull-down transistors;

wherein said plural input transistors are connected to said first node, and wherein said output pull-down transistor comprises an enable transistor in use selectively enabled by an enabling signal at its control gate.

11. A logic gate comprising a current mirror circuit having a supply node, a first node and a second node wherein application of a first current at said first node causes a second current at said second node, plural input pull-down transistors connected between a reference node and one of said first and second nodes, and an output pull-down transistor connected between the other of said first and second nodes and said reference node, wherein said supply node has a connection to a supply terminal, said plural input pull-down transistors have respective control terminals connected to a corresponding plurality of input terminals, and said output pull-down transistor has circuitry connected to its control node for biasing it on, wherein said plural input pull-down transistors are mutually substantially identical and wherein said output pull-down transistor is smaller than each of said plural input pull-down transistors;

wherein said output pull-down transistor is substantially half the width of each of said plural input pull-down transistors.

12. A logic gate comprising a current mirror circuit having a supply node, a first node and a second node wherein application of a first current at said first node causes a second current at said second node, plural input pull-down transistors connected between a reference node and one of said first and second nodes, and an output pull-down transistor connected between the other of said first and second nodes and said reference node, wherein the supply node has a connection to a supply terminal, said plural input pull-down transistors have respective control terminals connected to a corresponding plurality of input terminals, and said output pull-down transistor has circuitry connected to its control node for biasing it on, wherein said plural input pull-down transistors are mutually substantially identical and said output pull-down transistor is substantially the same as each of said plural input pull-down transistors and the current mirror circuit has a non-unity ratio.

13. The logic gate of claim 12 wherein at least one of said plural input pull-down transistors is connected in series with a second of said plural input pull-down transistors.

14. The logic gate of claim 12 further comprising a disabling transistor connected between said reference node and one of said first and second nodes.

15. The logic gate of claim 12 further comprising an inverter having a circuit output, said inverter being connected to one of said first and second nodes.

16. A logic gate comprising a current mirror circuit having a supply node, a first node and a second node wherein application of a first current at the first node causes a second current at the second node, plural input pull-down transistors connected between a reference node and one of said first and second nodes, and an output pull-down transistor connected between the other of said first and second nodes and the reference node, wherein said supply node has a connection to a supply terminal, said plural input pull-down transistors have respective control terminals connected to a corresponding plurality of input terminals, and said output pull-down transistor has circuitry connected to its control node for biasing it on, wherein said plural input pull-down transistors are mutually substantially identical and wherein said output pull-down transistor is smaller than each of said plural input pull-down transistors;

the logic circuit further comprising a disabling transistor connected between the reference node and one of said first and second nodes.

* * * * *